(12) United States Patent
Ogawa et al.

(10) Patent No.: US 8,351,247 B2
(45) Date of Patent: Jan. 8, 2013

(54) SEMICONDUCTOR DEVICE INCLUDING MEMORY CELL HAVING CAPACITOR

(75) Inventors: Hiroyuki Ogawa, Yokohama (JP); Hiroyoshi Tomita, Yokohama (JP); Masato Takita, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 297 days.

(21) Appl. No.: 12/707,044

(22) Filed: Feb. 17, 2010

(65) Prior Publication Data

US 2010/0214823 A1 Aug. 26, 2010

(30) Foreign Application Priority Data

Feb. 20, 2009 (JP) .................................. 2009-37904

(51) Int. Cl.
*G11C 11/24* (2006.01)
(52) U.S. Cl. .............. 365/149; 365/230.03; 365/230.06; 365/205; 365/63
(58) Field of Classification Search .................. 365/149, 365/230.03, 230.06, 205, 63
See application file for complete search history.

(56) References Cited

U.S. PATENT DOCUMENTS

| 5,602,772 | A | 2/1997 | Nakano et al. | |
| 5,999,480 | A * | 12/1999 | Ong et al. | 365/230.06 |
| 6,449,182 | B1 * | 9/2002 | Ooishi | 365/63 |
| 6,949,830 | B2 | 9/2005 | Owada et al. | |
| 7,274,612 | B2 * | 9/2007 | Hosokawa et al. | 365/205 |
| 2009/0184351 | A1 | 7/2009 | Ogawa et al. | |

FOREIGN PATENT DOCUMENTS

| JP | 2-183489 A | 7/1990 |
| JP | 3-142872 A | 6/1991 |
| JP | 6-318679 A | 11/1994 |
| JP | 7-94597 A | 4/1995 |
| JP | 2004-172590 A | 6/2004 |
| JP | 2009-170750 A | 7/2009 |

* cited by examiner

*Primary Examiner* — Connie Yoha
(74) *Attorney, Agent, or Firm* — Westerman, Hattori, Daniels & Adrian, LLP

(57) ABSTRACT

A semiconductor device includes a semiconductor substrate; a memory cell array including a plurality of memory cells formed on the semiconductor substrate and arranged in a matrix in a first direction and a second direction on the surface of the semiconductor substrate; a plurality of sense amplifiers formed on the semiconductor substrate and including a first sense amplifier and a second sense amplifier; and a plurality of bit lines extending along the first direction above the memory cell array, and arranged side by side in the second direction, wherein the plurality of bit lines include a first bit line pair formed in a first wiring layer and a second bit line pair formed in a second wiring layer located above the first wiring layer.

11 Claims, 13 Drawing Sheets

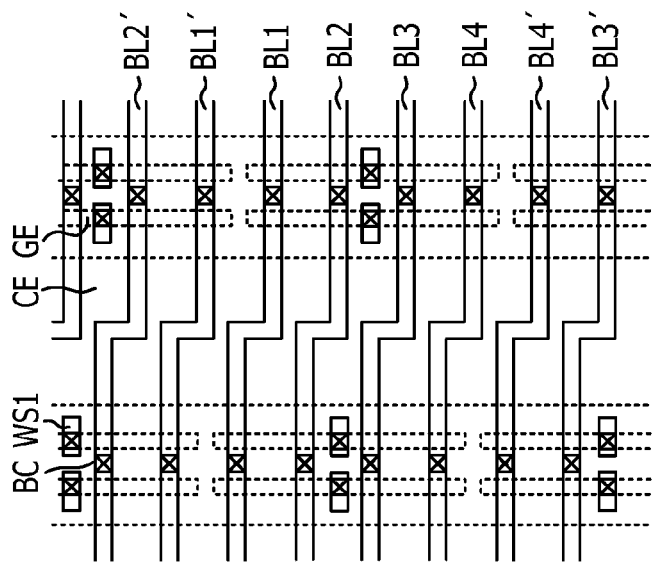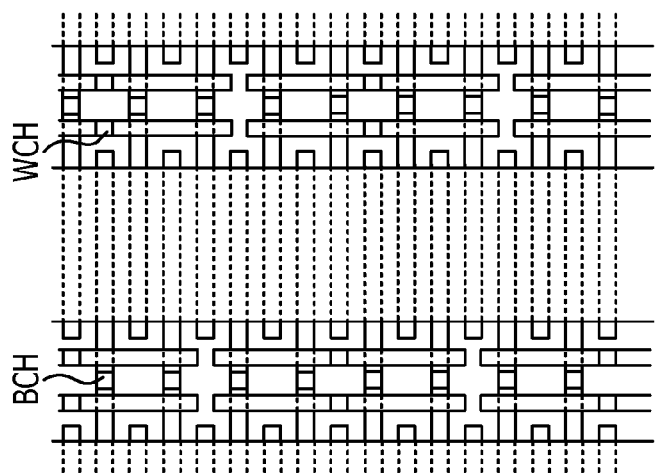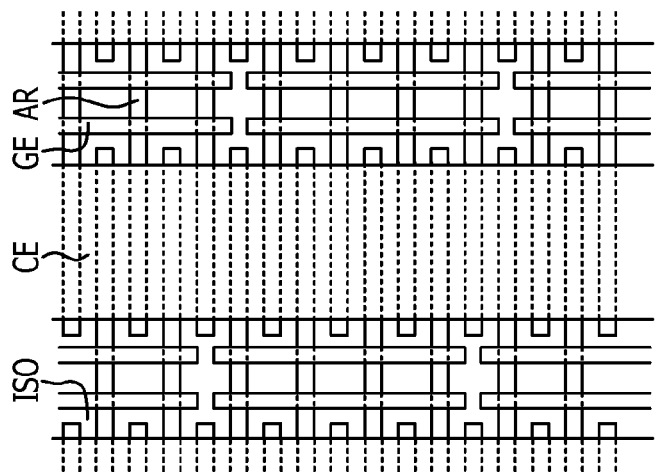

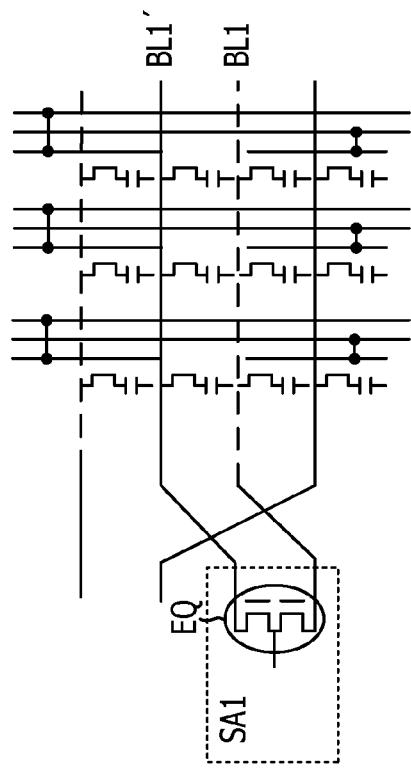
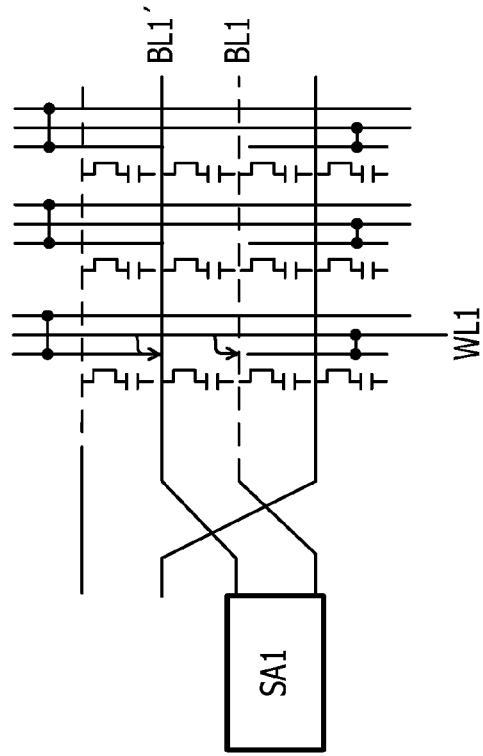
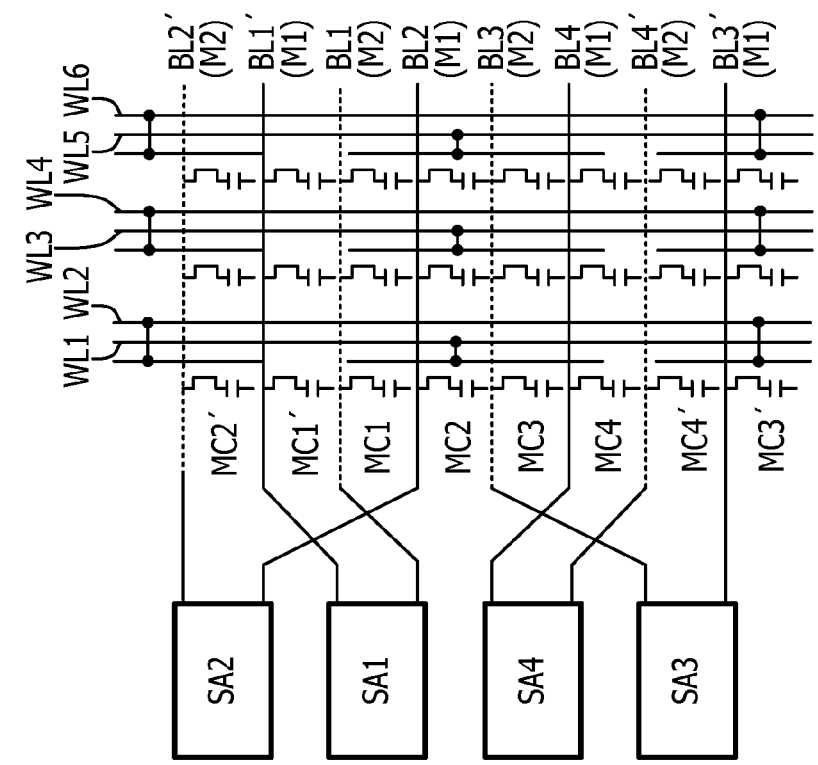

SEMICONDUCTOR DEVICE INCLUDING MEMORY CELL HAVING CAPACITOR

CROSS-REFERENCE TO RELATED APPLICATIONS

This application is based upon and claims the benefit of priority of the prior Japanese Patent Application No. 2009-37904, filed on Feb. 20, 2009 the entire contents of which are incorporated herein by reference.

FIELD

The present invention relates to a semiconductor device and a manufacturing method thereof, particularly to a semiconductor device including memory cells each having a transistor and a capacitor, and a manufacturing method thereof.

BACKGROUND

A memory cell formed by one transistor and one capacitor, i.e., a one-transistor, one-capacitor memory cell (e.g., dynamic random access memory (DRAM) cell and so forth) normally has the following structure. One current terminal of an access transistor is connected to a bit line, and the other current terminal is connected a storage electrode of a capacitor. Further, two memory cells are provided on one active region. For the two mutually adjacent memory cells, two gate electrodes are provided. That is, two gate electrodes are provided on one active region. Further, three source/drain regions are formed; one between the two gate electrodes and two outside the gate electrodes. The source/drain region formed between the two gate electrodes is set as a connection region to be connected to a bit line (bit line common to the two memory cells), and the bit line connection region is connected to the bit line. The source/drain regions formed outside the two gate electrodes are set as connection regions to be connected to capacitors, and the two capacitor connection regions are connected to the capacitors.

Memory cells are arranged in a matrix. The memory cells thus arranged in a matrix are normally provided with word lines in the column direction and bit lines in the row direction. As a method of arranging the memory cells, the word lines, the bit lines, and so forth, an arrangement system based on open bit lines and an arrangement system based on folded bit lines are known. In the open bit line system, two bit lines of different memory cell areas are connected to one sense amplifier. With this configuration, noise generated in one of the memory cell areas appears only in one of the paired bit lines. Therefore, the open bit line system has an advantage of being capable of reducing the area occupied by each memory cell, but has a disadvantage of being susceptible to noise. Meanwhile, in the folded bit line system, two bit lines provided in the same memory cell area are connected to one sense amplifier. One of the two bit lines is connected to a memory cell which reads stored content, while the other bit line is not connected to a memory cell which reads stored content. In the folded bit line system, therefore, noise generated in a target memory cell area appears in both of the paired bit lines, and thus the folded bit line system has an advantage of being resistant to noise. Meanwhile, the number of memory cells per bit line unit length of the folded bit line system is half that of the open bit line system. Therefore, the folded bit line system has a disadvantage of tending to have a larger area occupied by each memory cell.

As the structure of a capacitor included in a memory cell, a planar structure, a trench structure, a stack structure, and so forth are known. As the element isolation structure, a local-oxidation-of-silicon (LOCOS) structure, a trench isolation structure, and so forth are known. A reduction of the area occupied by each memory cell is effective to increase the integration density of memory cells. It is therefore desirable to reduce both the area occupied by the transistor and the area occupied by the capacitor.

A semiconductor device specialized for the DRAM employs a special structure called stack structure, for example, to reduce the capacitor area and increase the integration degree. Such a special structure causes no problem in the semiconductor device specialized for the DRAM. However, it is difficult to use this structure in a semiconductor device in which a memory, a logic circuit, and so forth are merged, due to a factor relating to the manufacturing process. To manufacture the merged semiconductor device in normal semiconductor processing, therefore, it is desirable to avoid a special structure such as the stack structure as the DRAM structure in the merged semiconductor device.

As an example capable of increasing the integration degree of memory cells, the following technique has been proposed. A memory cell area is divided into a plurality of sections along the bit line direction. Two upper and lower layers of bit lines are provided above the memory cells, and the memory cells are connected to the lower bit lines. The upper and lower bit lines replace each other at boundaries of the sections (i.e., in regions between adjacent sections). That is, specifically, a lower bit line replaces an upper bit line, and an upper bit line replaces a lower bit line. The bit lines are thus arranged such that one bit line serves as the lower bit line in one section and serves as the upper bit line in another adjacent section. With the two upper and lower layers of bit lines sterically intersecting with each other, the memory cells are provided at all intersections of the word lines and the bit lines even in the folded bit line system.

Further, as another example increasing the integration degree of memory cells, a technique has been proposed which provides a capacitor on a sidewall of a trench for isolating an access transistor, to thereby use the trench for providing a capacitor as well as for element isolation.

Further, as another example increasing the integration degree of memory cells, the following technique has been proposed. A local-oxidation-of-silicon (LOCOS) type field insulating layer for defining active regions is first formed, and transistors are formed in the active regions. Thereafter, a trench is formed for each of the memory cells around the active regions adjacent to the transistors, and an impurity diffusion region is formed on a surface of the trench. Then, the impurity diffusion region is covered by a dielectric film to form a counter electrode on the surface of the trench. Further, a dielectric film and a storage electrode are laminated on the region. Thereby, a capacitor is formed in which the counter electrode is sandwiched by the diffusion region and the storage electrode.

Further, as another example increasing the integration degree of memory cells, a technique has been proposed which changes the arrangement of bit lines at an intermediate position on the bit lines in the longitudinal direction thereof, to thereby reduce interference noise between the bit lines.

SUMMARY

According to one aspect of the invention, a semiconductor device includes a semiconductor substrate; a memory cell array including a plurality of memory cells formed on the semiconductor substrate and arranged in a matrix in a first direction and a second direction on the surface of the semiconductor substrate; a plurality of sense amplifiers formed on the semiconductor substrate and including a first sense amplifier and a second sense amplifier; and a plurality of bit lines extending along the first direction above the memory cell array, and arranged side by side in the second direction, wherein the plurality of bit lines include a first bit line pair formed in a first wiring layer and a second bit line pair formed in a second wiring layer located above the first wiring layer, and wherein the first bit line pair is connected to the first sense amplifier, and the second bit line pair is connected to the second sense amplifier.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 3A to 3F are cross-sectional views of a semiconductor substrate illustrating a manufacturing process of memory cell wiring;

FIG. 4A is an equivalent circuit diagram of a memory cell array according to a second embodiment, in which bit lines are alternately formed by metal wirings of different layers, and FIGS. 4B and 4C are plan views illustrating patterns of a first metal wiring and a second metal wiring, respectively;

DETAILED DESCRIPTION OF THE EMBODIMENTS

Ogawa, who is one of the inventors of the present application, and his colleagues previously proposed, in Japanese Patent Application No. 2008-008825, a merged semiconductor device including a DRAM using a capacitor surrounded by a trench. Merged semiconductor devices based on this proposal have been continuously developed.

First Embodiment

With reference to the drawings, a first embodiment of a semiconductor device based on the above proposal will be described below.

Figure 1A:
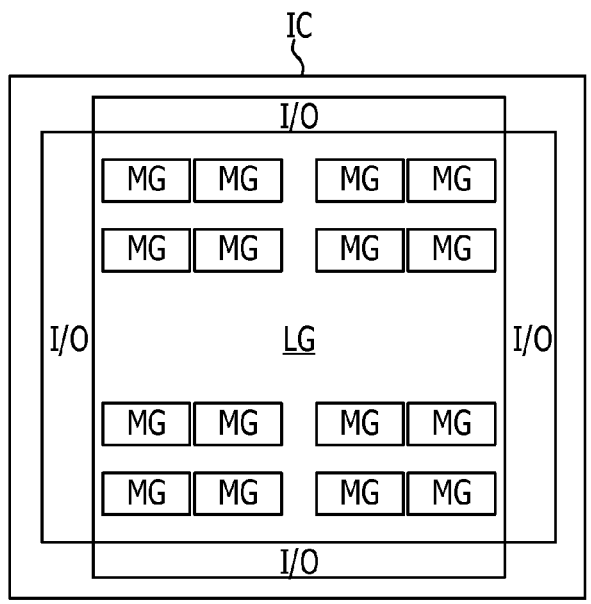
FIG. 1A is a plan view schematically illustrating a planar configuration of a memory-merged logic semiconductor device according to a first study example.

FIG. 1A schematically illustrates a planar configuration of a memory-merged logic IC (Integrated Circuit), i.e., a semiconductor device mounted with a memory-merged logic (hereinafter referred to as a "semiconductor device IC"). In a peripheral area of the semiconductor device IC, input/output circuits I/O are provided. In a central area of the semiconductor device IC, a logic circuit LG including distributed memory circuits MG is provided.

Figure 1B:
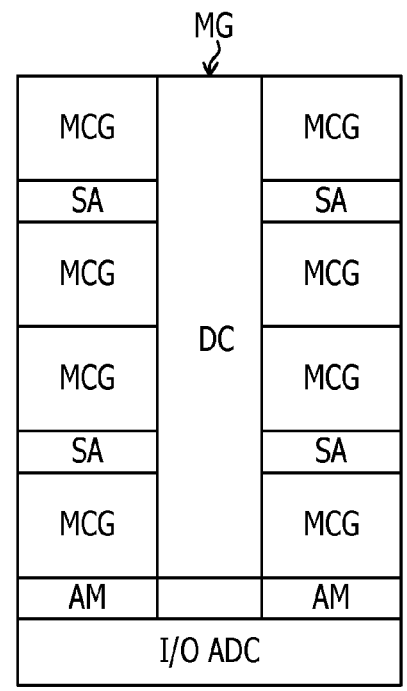
FIG. 1B is a plan view illustrating a configuration example of a memory circuit.

FIG. 1B illustrates a configuration example of the memory circuit MG. On both sides of a word decoder DC, memory cell groups MCG provided with distributed sense amplifiers SA are arranged. At one end (bottom of the drawing) of the word decoder DC, second amplifiers AM and an input/output address controller I/O ADC are provided.

Figure 1C:
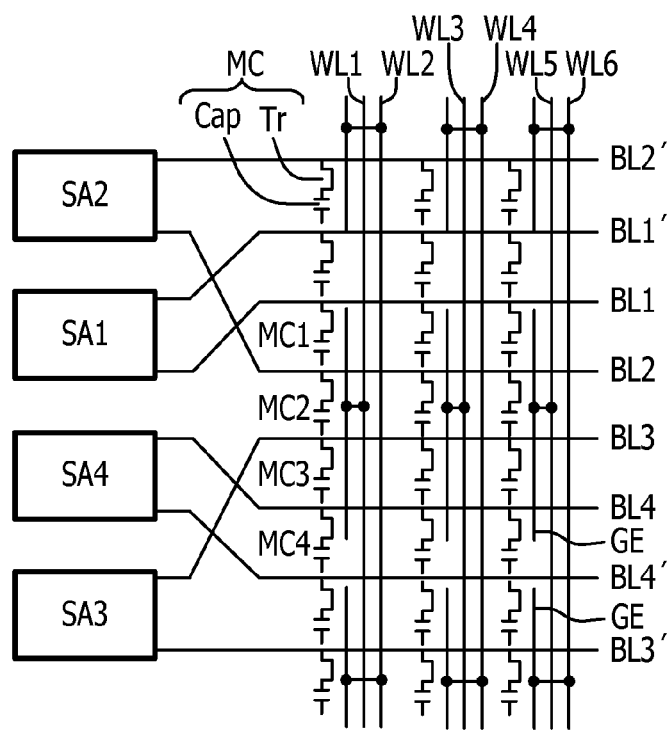
FIG. 1C is an equivalent circuit diagram of a memory cell group.

FIG. 1C illustrates an example of an equivalent circuit of a memory cell group MCG. Memory cells MC illustrated in FIG. 1C are arranged in a matrix along a surface of a semiconductor substrate. Each of the memory cells MC is formed by one access transistor Tr and one capacitor Cap. Each of the memory cells MC is a so-called one-transistor, one-capacitor memory cell. The access transistor Tr has one current terminal connected to a bit line BL, and a gate electrode connected to a specific word line WL. The capacitor Cap has a storage electrode connected to the other current terminal of the access transistor Tr. Gate electrodes GE, each of which extends for a sequence of the gates of four access transistors Tr, are formed by a polysilicon film. The gate electrodes GE are connected to metal word lines WL of an upper layer. The gate electrodes GE and the word lines WL are formed in the same direction with respect to the surface of the semiconductor substrate (hereinafter referred to as the vertical direction for convenience of explanation). Bit lines BL are arranged in a direction intersecting with the word lines WL. The bit lines BL are connected to the source and/or drains of the access transistors Tr. That is, the word lines WL are arranged in the vertical direction, and the bit lines BL are arranged in the horizontal direction. A plurality of the gate electrodes GE is arranged in a column in the vertical direction. The plurality of the gate electrodes GE are alternately connected to two metal word lines (e.g., WL1 and WL2).

Four bit lines BL1 to BL4 extend in the horizontal direction, and are arranged side by side in the vertical direction. For the four bit lines BL1 to BL 4, four reference bit lines BL1' to BL4' are arranged to extend in the same horizontal direction as that of the bit lines BL1 to BL 4. Two reference bit lines BL2' and BL1' are provided on the upper side of the bit lines BL2 and BL1. Further, two reference bit lines BL4' and BL3' are provided on the lower side of the bit lines BL4 and BL3. The bit lines BL cross immediately before the input to the sense amplifiers SA. With the crossing of the bit lines BL, a bit line BL (e.g., BL1 to BL4) and a reference bit line BL' (e.g., BL1' to BL4'), corresponding to the bit line BL, are connected to one sense amplifier SA. The bit lines BL and the reference bit lines BL' are formed by a first metal wiring and a second metal wiring on the polysilicon film, respectively. The word lines WL are formed by a third metal wiring. In this manner, the wiring is formed by three vertically stacked layers of metal wirings. Since the word lines WL extend for a long distance and are formed of a metal wiring, a resistance R is reduced, and a time constant RC is reduced. Accordingly, a high-speed operation may be achieved. Word contacts for two word lines WL may be located at different positions in the vertical direction (in other words, positions of the word contacts shift from one word line WL to the other word line WL in the vertical direction). Meanwhile, as in FIG. 3B described later, word contacts for two word lines WL may be located at the same position in the vertical direction. Specifically, the word contacts are located in central areas of the gate electrodes GE. At either of the locations, noise is generated in a substantially similar manner.

One electrode of the capacitor Cap is a storage electrode connected to the other current terminal of the access transistor Tr. A counter electrode of the capacitor Cap is shared by a plurality of other capacitors Cap. Sharing of the counter electrode by a plurality of capacitors Cap is not essential. In the present first embodiment, the number of access transistors Tr connected to one bit line BL is reduced to reduce parasitic capacitance. With the configuration including the word lines WL each divided into a plurality of segments (i.e., configuration including a plurality of gate electrodes GE arranged in series), all access transistors Tr arranged in the vertical direction are not selected at the same time. With this configuration, two bit lines BL in the same memory cell area are connected to one sense amplifier SA to make up a so-called folded bit line system.

Figure 2A:
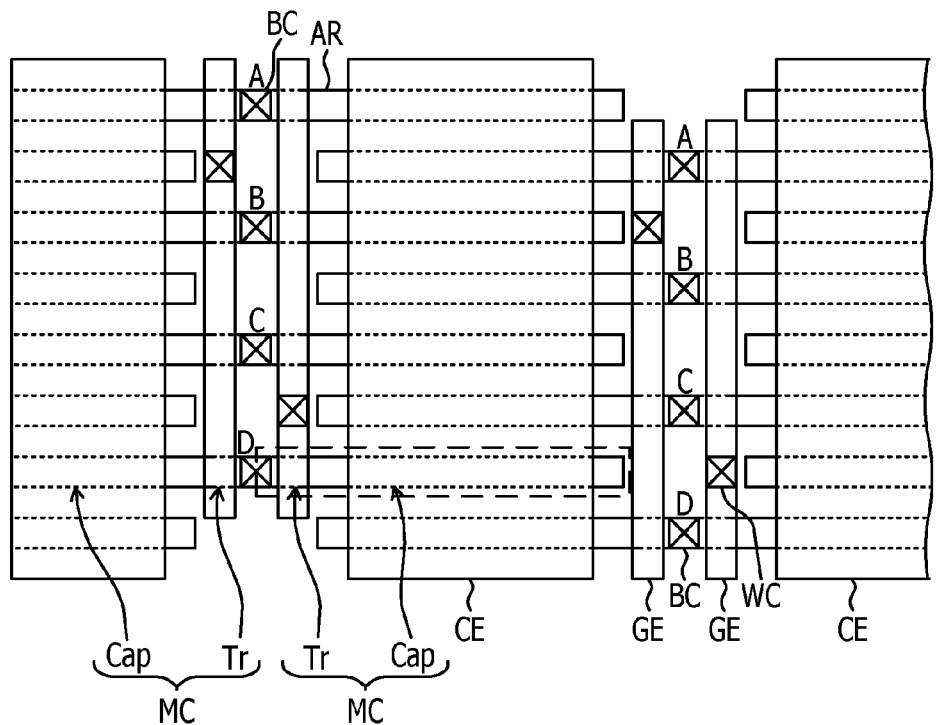
FIG. 2A is a plan view illustrating an example of planar arrangement in a memory cell group.
Figure 2B:
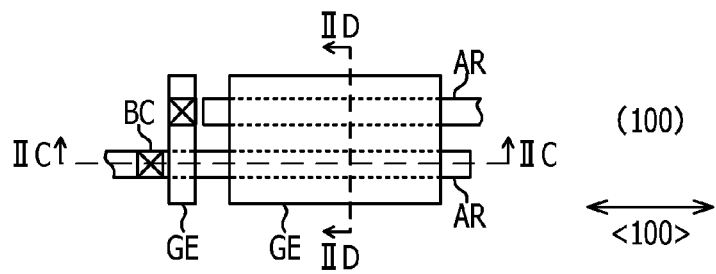
FIG. 2B is a plan view illustrating a part of the planar arrangement.

FIG. 2A illustrates an example of planar arrangement in the memory cell group MCG. FIG. 2B illustrates a part of the planar arrangement. As illustrated in FIGS. 2A and 2B, elongated active regions AR extend longitudinally in the horizontal direction. The elongated active regions AR are arranged side by side at a substantially constant pitch (pitch in the vertical direction). The active regions AR are arranged at the same position in the horizontal direction (row direction) in every other row.

A semiconductor substrate formed with a logic circuit is a silicon substrate, for example, and is normally a (001) substrate having a principal surface lying in the (001) plane. The active regions AR of the memory cells MC are preferably arranged with the longitudinal direction thereof aligned with the <010> or <100> direction.

One active region AR includes a bit line contact region BC at the center thereof, and includes memory cells MC on both sides thereof. Each of the memory cells MC includes the access transistor Tr and the capacitor Cap. The active regions AR are arranged side by side in the vertical direction. More specifically, the active regions AR are arranged with the horizontal position thereof alternately changed. That is, alternate active regions AR are arranged to be located at the same position in the horizontal direction. Each of the active regions AR has linear sides. The width of an access transistor Tr is substantially equal to the width of a capacitor Cap. If surrounding areas of the above-described active regions AR are etched substantially perpendicularly to the surface of the semiconductor substrate, the (100) or (010) plane appears in the sidewalls of the active regions AR.

As illustrated in FIG. 2A, counter electrodes CE are arranged to overlap parts of the active regions AR. Thus, capacitors Cap aligned in the column direction are formed under the counter electrodes CE. The counter electrodes CE do not overlap end portions of the active regions AR. Further, as illustrated in FIG. 2A, the capacitors Cap are aligned in the column direction to be located at the same position in the row direction. The bit line contact regions BC are alternately provided on both sides of the capacitors Cap. On both sides of each of the bit line contact regions BC in the column direction, an STI region for isolating the active regions AR is formed. In FIG. 2A, a bit line contact region BC represented as A and another bit line contact region BC represented as A are connected to the same bit line.

As the horizontal position of the active regions AR alternately changes, the bit line contact regions BC are alternately arranged with respect to the counter electrodes CE. That is, the capacitors Cap arranged in the column direction are alternately connected to the left access transistor Tr and the right access transistor Tr. Herein, each symbol A, B, C, and D assigned to the bit line contact regions BC identifies the bit line connected to the corresponding bit line contact region BC. That is, the symbols A, B, C, and D indicate that the bit line contact regions BC assigned therewith are connected to bit lines A, B, C, and D, respectively.

On both sides of the bit line contact regions BC, the gate electrodes GE of the access transistors Tr are provided. Intersecting portions of the gate electrodes GE and the active regions AR form the access transistors Tr. In each of the gate electrodes GE, a word line contact region WC is depicted.

Figure 2C:
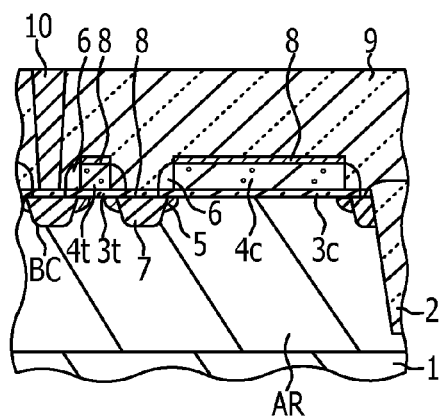
FIG. 2C is a cross-sectional view in the length direction of active regions cut along the line IIC-IIC of FIG. 2B.
Figure 2D:
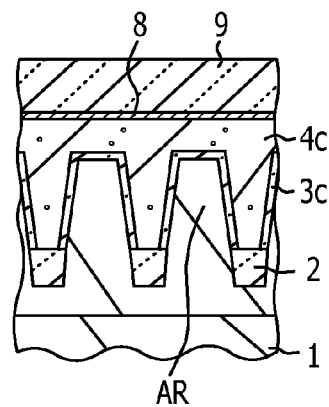
FIG. 2D is a cross-sectional view of capacitor portions in the width direction of the active regions cut along the line IID-IID of FIG. 2B.

FIG. 2B is a plan view of two memory cells MC arranged in the column direction. The figure illustrates a portion of an active region AR from the central bit line contact region BC to one end portion of the active region AR, i.e., a portion of the active region AR corresponding to approximately half the length thereof in the longitudinal direction. FIG. 2C is a cross-sectional view in the length direction of the active regions AR cut along the line IIC-IIC of FIG. 2B. FIG. 2D is a cross-sectional view of capacitor portions in the width direction of the active regions AR cut along the line IID-IID of FIG. 2B.

As illustrated in FIG. 2C, at substantially the center of each p-type (n-type in p-type cells) active region AR formed in a silicon substrate 1, an n-type (p-type in p-type cells) bit line contact region BC is provided. The bit line contact region BC forms one source or drain region of the access transistor Tr. On the right side, as illustrated in FIG. 2C, of the bit line contact region BC, a gate electrode is formed which includes a gate insulating film 3t and a gate electrode 4t formed on the gate insulating film 3t. On the right side, as illustrated in FIG. 2C, of the gate electrode 4t, a source/drain region 7 is formed. The source/drain region 7 is an n-type (p-type in p-type cells) source or drain region.

The gate electrode including lamination of the gate insulating film 3t and the gate electrode 4t is formed, and n-type (p-type in p-type cells) extensions 5 are formed in the active region AR on both sides of the gate electrode. Thereafter, sidewall spacers 6 are formed on sidewalls of the gate electrode 4t. After the formation of the sidewall spacers 6, ion implantation is performed to form the bit line contact region BC serving as a source or drain region, and to form the source/drain region 7.

On the side of the gate electrode 4t across from the source/drain region 7, a capacitor dielectric film 3c and a counter electrode 4c are provided. On a surface of the bit line contact region BC serving as a source or drain region, on a surface of the source/drain region 7, and on a surface of the counter electrode 4c, a silicide layer 8 made of cobalt silicide (CoSi), nickel silicide (NiSi), or the like is formed. Then, a lower interlayer insulating film 9 for covering the memory cells MC is deposited. Thereafter, a contact hole for exposing the bit line contact region BC is formed by etching, and the contact hole is filled with tungsten to form a conductive plug 10.

The access transistors Tr included in the n-type memory cells MC described above may be formed by the same process for forming n-type MOS (Metal-Oxide Semiconductor) transistors (hereinafter referred to as NMOS transistors) of the logic circuit LG. Meanwhile, the access transistors Tr included in p-type memory cells may be formed by the same process for forming p-type MOS transistors (hereinafter referred to as PMOS transistors). The source or drain regions of the access transistors Tr may be formed by the same process for forming extension regions of logic transistors. In this case, during the ion implantation for forming source or drain regions of the logic transistors, the ion implantation for forming source or drain regions is not performed in the memory cells MC.

As illustrated in FIG. 2D, trenches are formed around the active regions AR, and an STI insulating film 2 is buried in the trenches. FIG. 2D illustrates a cross section of the capacitor regions. As illustrated in FIG. 2D, in the capacitor regions, the STI insulating film 2 is etched back to, on bottom portions of the trenches, a thickness necessary for element isolation. Further, in this process, concave portions exposing the sidewalls of the active regions AR are formed. The depth of the concave portions is preferably equal to or greater than the width of the active regions AR, and more preferably equal to or greater than twice the width of the active regions AR. The capacitor dielectric film 3c is formed on the surfaces of the active regions AR and the sidewalls of the active regions AR exposed in the concave portions. The counter electrodes 4c are formed on the capacitor dielectric film 3c. Further, as illustrated in FIG. 2D, surfaces of the counter electrodes 4c are formed with the silicide layer 8, similarly as in the gate electrode.

In the above-described manner, the capacitor regions are covered by the counter electrodes 4c. Thus, the ion implantation for forming extensions and source and drain regions is not performed in the capacitor regions. Therefore, an operation is performed in which a voltage sufficient to turn on the access transistors Tr is applied to the counter electrodes 4c, to thereby induce channels of the access transistors Tr and form capacitances between the channels and the counter electrodes 4c. Another ion implantation for forming the capacitors Cap is not performed. Therefore, the portions of the active regions AR corresponding to the capacitor portions have a low impurity concentration. The width of the active regions AR may be selected so that depletion layers extending from the sidewalls of the active regions AR (mutually facing sidewalls formed with the counter electrodes 4c) are connected to each other. In this case, the depletion layers are connected to each other in the width direction of the active regions AR.

FIGS. 3A to 3F are plan views of a semiconductor substrate illustrating a manufacturing process of a wiring structure.

FIG. 3A is a diagram illustrating a state in which an element isolation region ISO for defining the active regions AR is formed in a semiconductor substrate, as illustrated in FIG. 2A. A polysilicon film is laminated on an insulating film to form the gate electrodes GE. FIG. 3A also illustrates a state in which the counter electrodes CE are formed. Each of the gate electrodes GE has a shape shared by four access transistors Tr arranged in succession in a second direction.

As illustrated in FIG. 3B, a lower interlayer insulating film is formed to cover the gate electrodes GE and the counter electrodes CE. After the formation of the lower interlayer insulating film, portions of the lower interlayer insulating film on the bit line contact regions BC and the word line contact regions WC are removed by etching. Thereby, bit line contact holes (holes for forming conductive plugs for bit line contacts) BCH and word line contact holes (holes for forming conductive plugs for word line contacts) WCH are formed.

Then, as illustrated in FIG. 3C, a wiring layer is formed on the lower interlayer insulating film. Thereafter, the wiring layer is patterned to form the bit lines BL1 to BL4 and the reference bit lines BL1' to BL4'. The bit lines BL1 to BL4 and the reference bit lines BL1' to BL4' are connected to the active regions AR in the bit line contact regions BC. As for the word lines WL, a first word subsidiary wiring WS1 connected to the word line contact regions WC is formed at the same time as the formation of the above-described bit lines BL, for example. For example, a TiN layer, an Al layer, and a TiN layer are sequentially laminated to form a first metal wiring layer. Thereafter, the first metal wiring layer is patterned by photolithography and dry etching. Thereby, the bit lines BL and the first word subsidiary wirings WS1 are formed by a first metal wiring. As illustrated in the equivalent circuit of FIG. 1C, each of the bit lines BL and the corresponding reference bit line BL' are cross-wired at a stage before being connected to the sense amplifier SA.

Figure 3F:
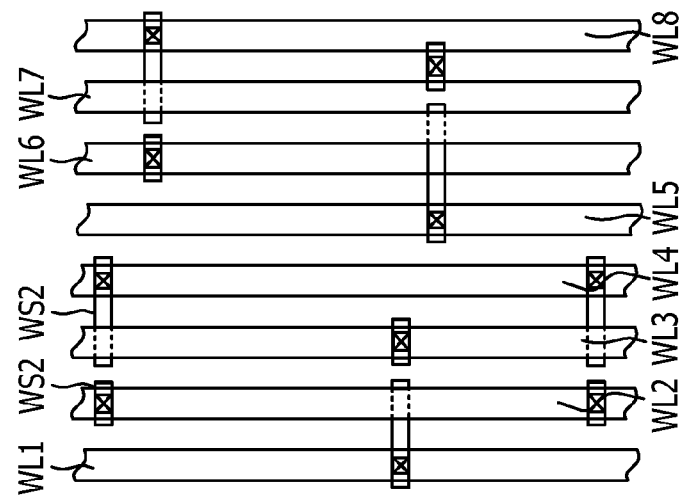
Figure 3E:
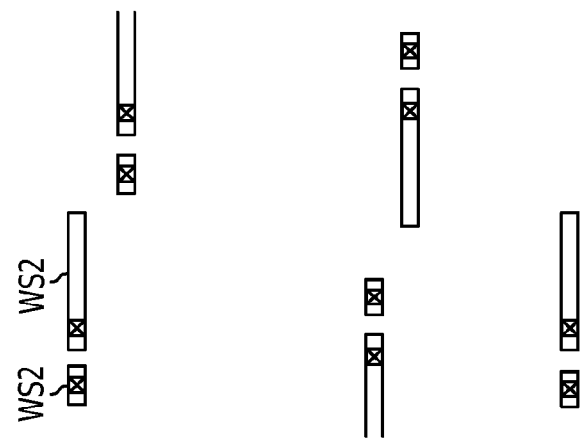
Figure 3D:
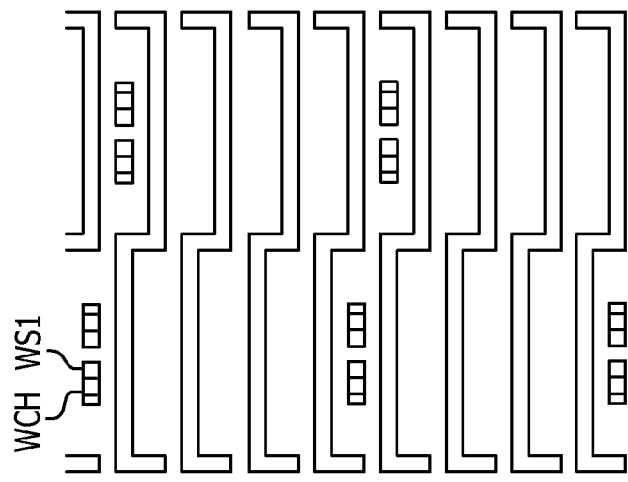

As illustrated in FIG. 3D, the bit lines BL are covered by a first interlayer insulating film, and thereafter the first interlayer insulating film is formed with the word line contact holes WCH. Specifically, the word line contact holes WCH reaching the first word subsidiary wirings WS1 are formed by etching the word line contact regions WC. The process of FIG. 3D is similar to that of FIG. 3B.

As illustrated in FIG. 3E, a second metal wiring layer is formed on the first interlayer insulating film. Thereafter, the second metal wiring layer is patterned to form second word subsidiary wirings WS2 by a second metal wiring. The second word subsidiary wirings WS2 are connected to the first word subsidiary wirings WS1. To allow adjustment of the distance in the lateral direction (first direction) of the word line contacts, the length of one of the two second word subsidiary wirings WS2 is adjusted. Then, the second word subsidiary wirings WS2 are covered by a second interlayer insulating film, and thereafter contact holes are provided by etching the second interlayer insulating film. The contact holes are provided in the word line contact regions WC of the second word subsidiary wirings WS2, the positions of which have been adjusted.

As illustrated in FIG. 3F, a third metal wiring layer is formed on the second interlayer insulating film. Thereafter, the third metal wiring layer is patterned. Thereby, the word lines WL are formed by a third metal wiring. The word lines WL are connected to the second word subsidiary wirings WS2. Each of the word lines WL forms a relatively long wiring, and thus is desirably formed by a metal wiring having a low wiring resistance. The word lines WL are connected to the gate electrodes GE of the access transistors (selection transistors) Tr via two stages of word subsidiary wirings.

In the semiconductor device according to the first embodiment described above, during the reading of data stored in memory cells MC1 to MC4 into the bit lines BL1 to BL4, the influence of the voltage fluctuation of the bit line BL3 on the bit line BL2 is smaller than the influence of the voltage fluctuation of the bit line BL1 on the bit line BL2. For example, in some cases, the result of reading of the memory cell MC2 is not changed by the state of the memory cell MC3, while the result of reading of the memory cell MC2 is changed by the state of the memory cell MC1. The result of reading of the memory cell MC2 changed by the state of the memory cell MC1 is considered to be attributed to crosstalk between the bit lines BL. Herein, the result of reading of the memory cell MC2 unchanged by the state of the memory cell MC3 is considered to be attributed to the word subsidiary wirings WS performing a shielding function. During data reading with the bit lines BL1 to BL 4, the reference bit lines BL1' to BL4' provided on the upper and lower sides of the bit lines BL1 to BL 4, for example, are not used for data reading.

Further, noise due to the capacitances between the bit lines BL is generated and substantially increased when the sense amplifiers SA start to operate and the outputs are increased. In view of this, it is desirable to set the sense amplifiers SA to have the same operation timing.

Further, in some cases, the bit lines BL2 and BL3 on both sides of the word subsidiary wirings WS are affected by the voltage fluctuation occurring when the word line WL1 is turned on. In this case, the bit lines BL1 and BL4 are only slightly affected or not affected. The influence of the voltage change of the word line WL1 on the bit lines BL2 and BL3 is considered to be attributed to the connection of the bit lines BL2 and BL3 via the contacts to the gate electrodes GE passing through the word subsidiary wirings WS, and thus to the transmission of the influence of the voltage change through this path. The bit lines BL1 and BL4 are assumed to be less affected due to the long distance thereof from the word subsidiary wirings WS.

As a first measure to address the large influence of the voltage fluctuation of the bit line BL1 on the bit line BL2 in the reading of data stored in the memory cells MC1 to MC4 into the bit lines BL1 to BL4, it is desirable to reduce the parasitic capacitance between the bit lines BL. If adjacent bit lines BL are formed by wirings of different layers, the distance between the bit lines BL is increased, and the parasitic capacitance is reduced.

Second Embodiment

FIGS. 4A to 4C illustrates an equivalent circuit diagram of a memory cell array according to a second embodiment, in which the bit lines BL are alternately formed by metal wirings of different layers, and FIGS. 4B and 4C are plan views illustrating patterns of the first metal wiring and the second metal wiring.

As illustrated in FIG. 4A, the bit lines BL2 and BL4 and the reference bit lines BL1' and BL3' are formed by the first metal wiring. The bit lines BL1 and BL3 and the reference bit lines BL2' and BL4' are formed by the second metal wiring. FIGS. 4B and 4C illustrate specific examples of patterns of the first metal wiring and the second metal wiring. The bit lines BL are arranged so that a bit line BL formed by the first metal wiring and a bit line BL formed by the second metal wiring alternate with each other (on the assumption that the reference bit lines BL' are also included in the bit lines BL). The state of connection between the bit lines BL and the sense amplifiers SA is substantially the same as that of FIG. 1C. However, the present configuration is different from the configuration of FIG. 1C in that the bit lines BL are formed by the first metal wiring and the second metal wiring, and that each of the sense amplifiers SA is connected to one bit line BL formed by the first metal wiring and one bit line BL formed by the second metal wiring. In the second embodiment, adjacent bit lines BL are formed by metal wiring of different layers. Therefore, the capacitance between the bit lines BL may be substantially reduced.

As illustrated in FIG. 4B, the sense amplifier SA1 reads the potential difference between the bit line BL1 and the reference bit line BL1' to read information. Therefore, it is desirable that the bit line BL1 and the reference bit line BL1' are at the same potential prior to data reading. The sense amplifier SA1 includes an equalizer EQ. Prior to data reading, the equalizer EQ is turned on to set the bit line BL1 and the reference bit line BL1' to the same potential. Then, the equalizer EQ is turned off to allow the bit line BL1 and the reference bit line BL1' to have separate potentials. When the equalizer EQ is turned off, noise due to coupling is generated. In this case, if the bit line BL1 and the reference bit line BL1' have different capacitances, the bit line BL1 and the reference bit line BL1' affected by the noise have different fluctuations in potential.

The sense amplifier SA1 performs the operation as described above. It is therefore desirable to set the bit line BL1 and the reference bit line BL1' connected to the same sense amplifier SA1 to have the equal capacitance. This setting is substantially desirable in the detection of a minute potential difference. When the bit line BL1 and the reference bit line BL1' are formed by wirings of different layers, it is difficult to equalize the capacitances. Even if the capacitances are equalized based on close examination of the layout, the capacitances are expected to be affected by the fluctuation of the process and thus gradually vary from each other. Specifically, influences such as a shift due to etching, a fluctuation of the amount of polishing by chemical mechanical polishing (CMP), and the degree of defocus in lithography may cause the variation. If such factors affect only the first metal wiring, for example, imbalance between the capacitances is caused. In this case, the capacitance of the reference bit line BL1' fluctuates, while the capacitance of the bit line BL1 remains unchanged.

As illustrated in FIG. 4C, in data reading, the potential of the word line WL1 is changed to turn on the access transistors Tr of the memory cells MC. If the bit lines BL1 and BL1' are formed by wirings of different layers and form different capacitances with the word line WL1, different potential fluctuation rates are obtained. Therefore, the bit lines BL connected to the same sense amplifier SA are preferably formed by wirings of the same layer.

Figure 5B:
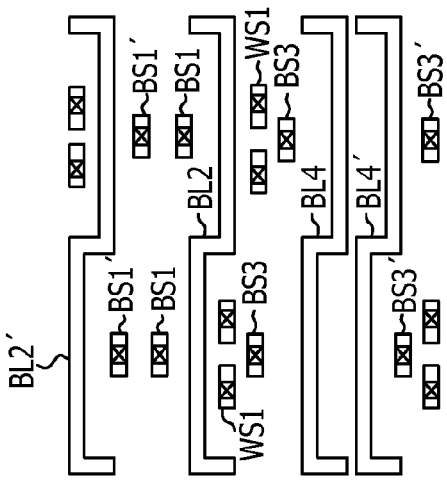
FIGS. 5B and 5C are plan views illustrating patterns of the first metal wiring and the second metal wiring, respectively.
Figure 5C:
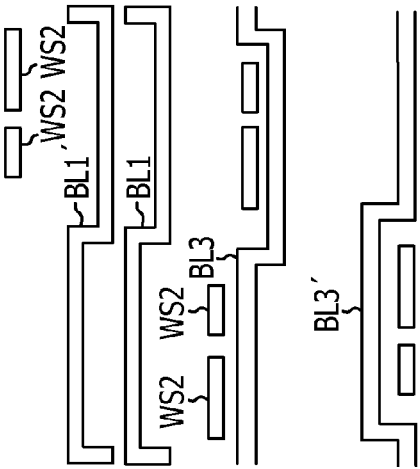
Figure 5A:
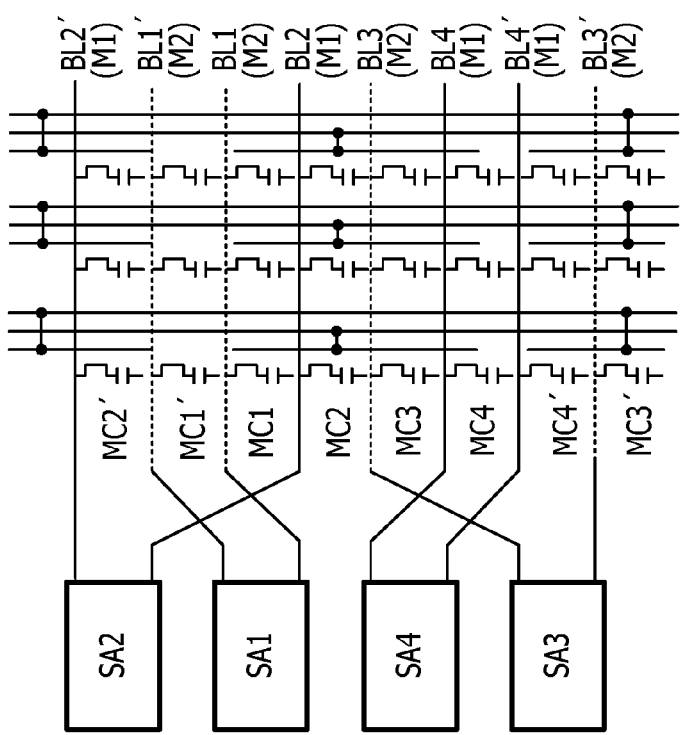
FIG. 5A is an equivalent circuit diagram illustrating a wiring structure of a semiconductor device according to a first embodiment.

FIG. 5A is an equivalent circuit diagram illustrating a wiring structure of the semiconductor device according to the first embodiment, and FIGS. 5B and 5C are plan views illustrating patterns of the first metal wiring and the second metal wiring.

As illustrated in FIG. 5A, as the bit lines BL1 to BL4, the bit lines BL1 and BL3 formed by the second metal wiring and the bit lines BL2 and BL4 formed by first metal wiring are alternately arranged. The present configuration is similar to the configuration of the second embodiment in that the bit lines BL1 to BL4 are alternately provided by the second metal wiring layer and the first metal wiring layer. The reference bit line BL1' is formed by the second metal layer, and is adjacent to the bit line BL1 formed by the second metal layer. The wiring layers forming the reference bit lines BL1' to BL4' are different from the wiring layers of the second embodiment. The adjacent bit lines BL1 and BL1' forming a pair are formed by the same wiring layer, and the adjacent bit lines BL4 and BL4' forming a pair are formed by the same wiring layer. However, the reference bit lines BL' are not used to read information. Therefore, the interference between the bit lines BL1 and BL1' does not cause a problem. Similarly, the interference between the bit lines BL4 and BL4' does not cause a problem. The reference bit line BL2' is formed by the first metal wiring, and the reference bit line BL3' is formed by the second metal wiring.

FIG. 5B illustrates a pattern of the first metal wiring. The bit lines BL2 and BL4 and the reference bit lines BL2' and BL4' are formed by the first metal wiring. At the same time, bit subsidiary wirings BS1, BS3, BS1', and BS3' for the bit lines BL1 and BL3 and the reference bit lines BL1' and BL3', respectively, and the word subsidiary wirings WS1 are formed.

FIG. 5C illustrates a pattern of the second metal wiring. The bit lines BL1 and BL3 and the reference bit lines BL1' and BL3' are formed by the second metal wiring. At the same time, the word subsidiary wirings WS2 connected to the word subsidiary wirings WS1 are formed.

Returning to FIG. 5A, the bit line BL and the reference bit line BL' assigned with the same number are connected to the sense amplifier SA assigned with the same number (e.g., the bit lines BL1 and BL1' connected to the sense amplifier SA1, and the bit lines BL2 and BL2' connected to the sense amplifier SA2). Herein, the bit line BL and the reference bit line BL' assigned with the same number are formed by the same wiring layer. Further, the bit lines BL1 to BL4 are alternately wired by different layers. Therefore, the capacitances thereof may be reduced.

According to the first embodiment, the upper-layer wiring is more susceptible to the potential fluctuation of the word contacts than the lower-layer wiring. This is because the bit line BL3 adjacent to the word subsidiary wirings WS for contacts (word line contact regions WC) is formed by the second metal layer, which is the upper-layer wiring.

Figure 6B:
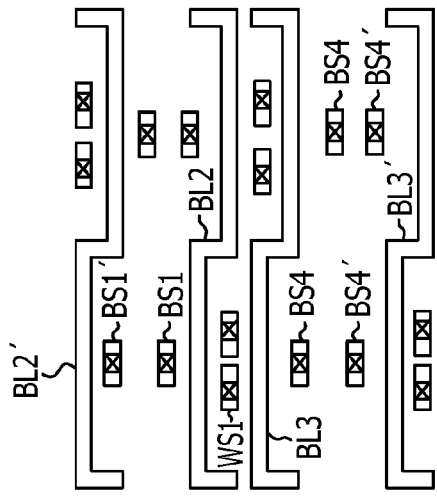
FIGS. 6B and 6C are plan views illustrating patterns of the first metal wiring and the second metal wiring, respectively.
Figure 6C:
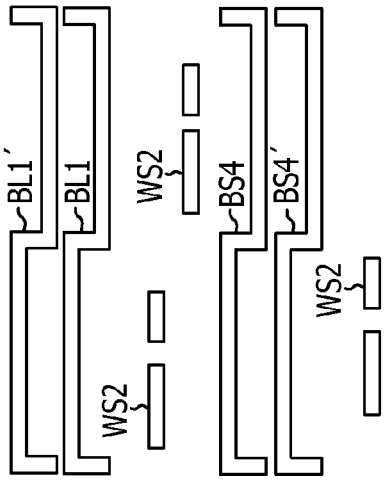
Figure 6A:
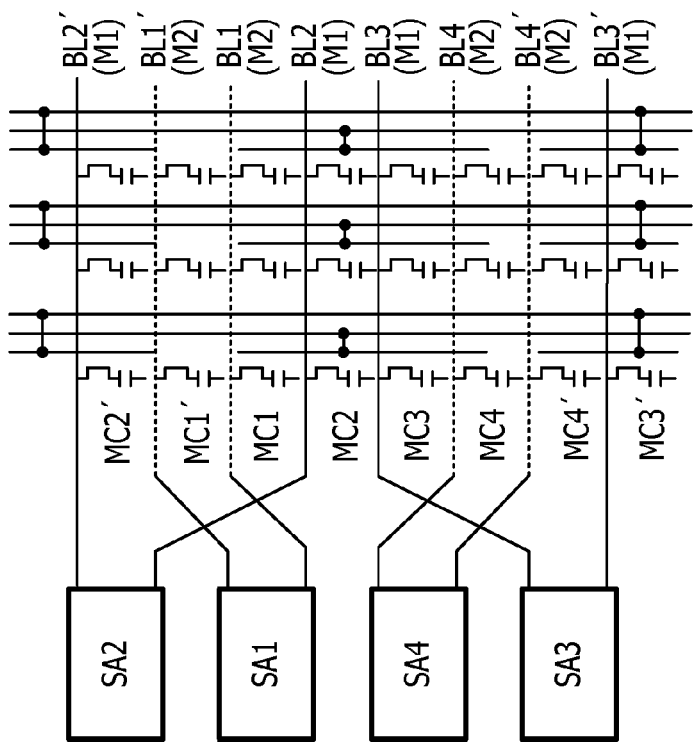
FIG. 6A is an equivalent circuit diagram illustrating a wiring structure of a semiconductor device according to a second embodiment.

FIG. 6A is an equivalent circuit diagram illustrating a wiring structure of a semiconductor device according to the second embodiment, and FIGS. 6B and 6C are plan views illustrating patterns of the first metal wiring and the second metal wiring.

As illustrated in FIG. 6A, the bit lines BL2 and BL3 provided on both sides of the word contacts are formed by the first metal wiring (M1). The bit lines BL1 and BL4 located outside and adjacent to the bit lines BL2 and BL3, respectively, are formed by the second metal wiring (M2), which is the upper layer. The present configuration is different from the configuration of the first embodiment in that the first metal wiring and the second metal wiring forming the bit lines BL3 and BL4, respectively, are reversed. Along with this change, the first metal wiring and the second metal wiring forming the reference bit lines BL3' and BL4', respectively, are also reversed.

The first metal wiring illustrated in FIG. 6B is the same as the first metal wiring of the first embodiment illustrated in FIG. 5B in an upper portion including the bit line BL2 (and the word subsidiary wirings WS1 located therebelow). In a lower portion including the bit line BL3, the bit lines BL (BL') and the bit subsidiary wirings BS (BS') are reversed. That is, the bit lines BL3 and BL3' and the bit subsidiary wirings BS4 and BS4' are formed.

The second metal wiring illustrated in FIG. 6C is the same as the second metal wiring of the first embodiment illustrated in FIG. 5C in an upper portion including the bit line BL1 (and the word subsidiary wirings WS2 located therebelow). In a lower portion including the bit line BL4, the bit lines BL4 and BL4' are formed.

Returning to FIG. 6A, except for the bit lines BL2' and BL3' formed by the first metal wiring and located at the upper and lower ends, respectively, the bit lines BL1' and BL1 formed by the second metal wiring, the bit lines BL2 and BL3 formed by the first metal wiring, and the bit lines BL4 and BL4' formed by the second metal wiring are sequentially arranged to be adjacent to each other. The bit lines BL1' and BL1 and the bit lines BL4 and BL4' are formed by the second wiring of the same layer, and are arranged to be adjacent to each other. However, the reference bit lines BL1' and BL4' are not used to read information, and thus do not cause a problem. The bit lines BL2 and BL3 adjacent to each other across the word line contacts are formed by the same first metal wiring. However, the word line contacts perform a shielding function. Therefore, the interference is small. The bit lines BL2 and BL3 on both sides of the word line contacts are formed by the lower wiring layer. Therefore, the influence of the potential fluctuation of the word lines WL on the bit lines BL may be reduced. Two inputs of each of the sense amplifiers SA are connected to the bit lines BL formed by the same wiring layer. Therefore, it is easy to equalize the capacitances of the bit lines BL.

The twisted structure may be used not only between the bit lines BL and the sense amplifiers SA but also at an intermediate position on the bit lines BL to change the arrangement of the bit lines BL. With appropriate selection of adjacent bit lines BL, noise may be suppressed. In one arrangement, one bit line BL is adjacent to two other bit lines BL or the like. When the bit line BL is twisted once to change the arrangement, there are four candidates adjacent to any bit line BL. Description will be made with the bit line BL1 taken as an example. The bit line BL1 is twisted to make the single bit line BL1 adjacent to all lines of the following cases 1) to 4). Specifically, the line of the case 1) is the reference bit line BL1' of the bit line BL1. The line of the case 2) is another bit line BL, e.g., the bit line BL2. The line of the case 3) is the reference bit line BL2' of the above-described another bit line BL2. The line of the case 4) is still another bit line BL3 or BL4, still another reference bit line BL3' or BL4', or a bit line end or a dummy bit line (which may also be assumed as a bit line end).

Figure 7A:
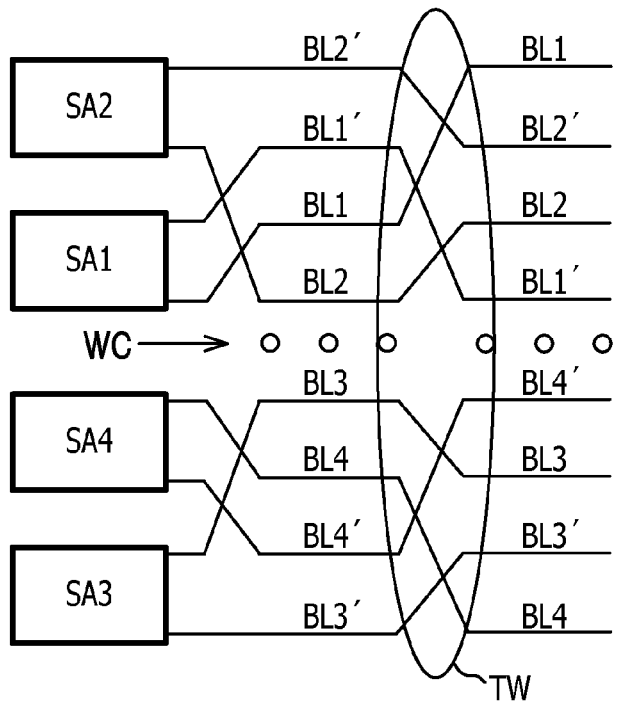
FIG. 7A is an equivalent circuit diagram illustrating a twisted structure of bit lines.

Description will be made with reference to FIG. 7A. The bit line arrangement is changed by a twist TW. The bit line BL1 is adjacent to the bit lines BL1', BL2, BL2', and a bit line end, as described in the above example. The bit line BL2 is adjacent to the bit line BL1 of the case 2), the bit line BL3 of the case 4), the bit line BL1' of the case 3), and the bit line BL2' of the case 1). The bit line BL3 is adjacent to the bit line BL2 of the case 4), the bit line BL4 of the case 2), the bit line BL4' of the case 3), and the bit line BL3' of the case 1). The bit line BL4 is adjacent to the bit line BL3 of the case 2), the bit line BL4' of the case 1), the bit line BL3' of the case 3), and a bit line end of the case 4).

In the case 1), the reference bit line BL' of a bit line BL does not contribute to the noise. In the case 2), after the operation of the sense amplifiers SA, another bit line BL operates in the reverse direction to cancel a signal. In the case 3), after the operation of the sense amplifiers SA, the reference bit line BL' of another bit line BL also operates in the reverse direction to cancel a signal. Therefore, the noise is offset. Accordingly, the line of the case 4) is left as the source of the noise. If the twist TW is used to change another bit line BL adjacent to one bit line BL, the length of a portion of the one bit line BL adjacent to the another bit line BL is reduced by half. In other words, the capacitance between the one bit line BL and another bit line BL adjacent thereto is reduced by approximately half, and the noise received from the another bit line BL is reduced by approximately half.

With the word line contacts taken into account, the length of the bit line BL adjacent to the word line contacts may be reduced by approximately half. This reduction in length leads to a reduction in bit line capacitance, and allows an increase in signal strength.

Figure 7B:
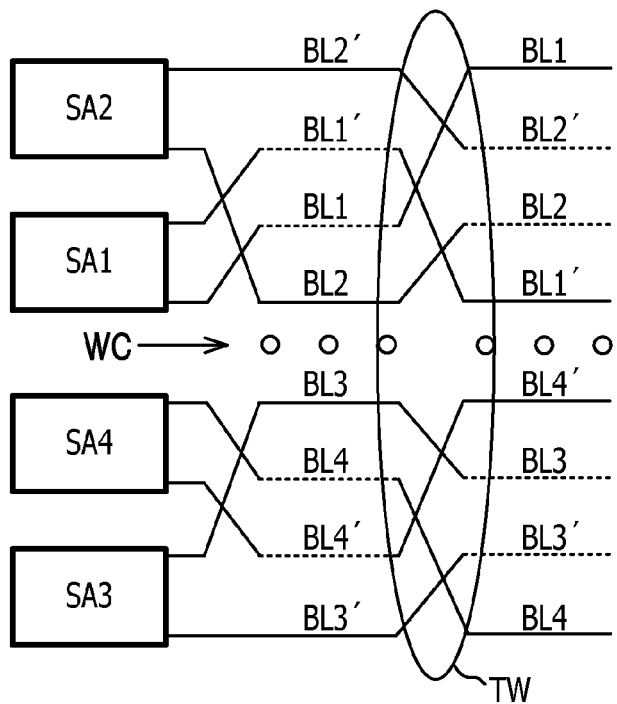
FIG. 7B is an equivalent circuit diagram according to a third embodiment obtained by introducing a twist into the bit line arrangement of the second embodiment illustrated in FIG. 6A.

FIG. 7B illustrates a third embodiment obtained by introducing the twist TW into the bit line arrangement of the second embodiment illustrated in FIG. 6A. If the difference in the first metal wiring and the second metal wiring is ignored, the bit line arrangement of FIG. 7B is the same as that of FIG. 7A. If the difference in the first metal wiring and the second metal wiring is taken into account, the left side of the twist TW of FIG. 7B is the same as that of FIG. 6A. On the right side of the twist TW, the connection is configured so that the first metal wiring and the second metal wiring are reversed on either side of the twist TW. That is, a bit line BL formed by the first metal wiring on the left side of the twist TW is formed by the second metal wiring on the right side of the twist TW. A bit line BL formed by the second metal wiring on the left side of the twist TW is formed by the first metal wiring on the right side of the twist TW. The effect of the second embodiment and the effect of the above-described twist may both be obtained. Further, if the twist TW is introduced substantially at the center of each of the bit lines BL to reverse the first metal wiring and the second metal wiring, it is easy to equalize the capacitances of all bit lines BL, and to keep balance among the capacitances of all bit lines BL. Such introduction of the twist TW also contributes to the adjustment of the start-up speeds of the sense amplifiers SA to the same value. Even if the bit line length is different between both sides of the twist, the configuration including the twist may help make it easy to keep balance among the capacitances of all bit lines BL and to help set the sense amplifiers SA to have substantially the same operation timing, as compared with the configuration not including the twist TW.

Figure 8A:
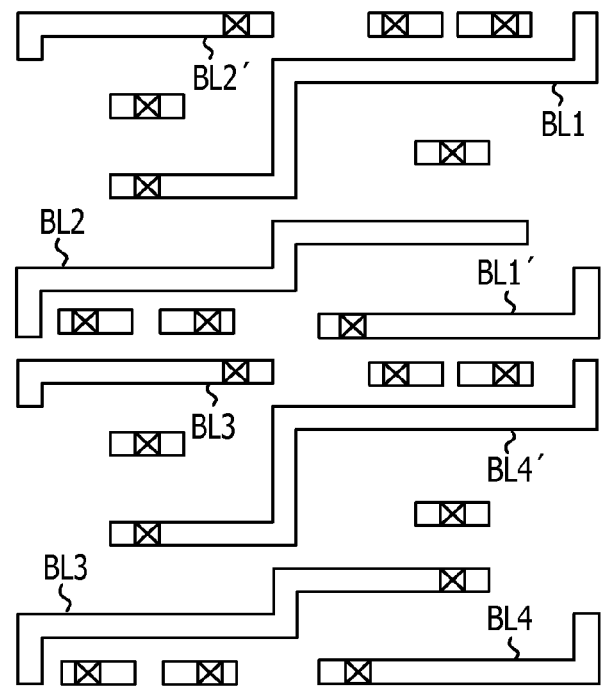
FIG. 8A is a plan view illustrating an example of a first metal wiring pattern for providing the twist illustrated in FIG. 7B.
Figure 8B:
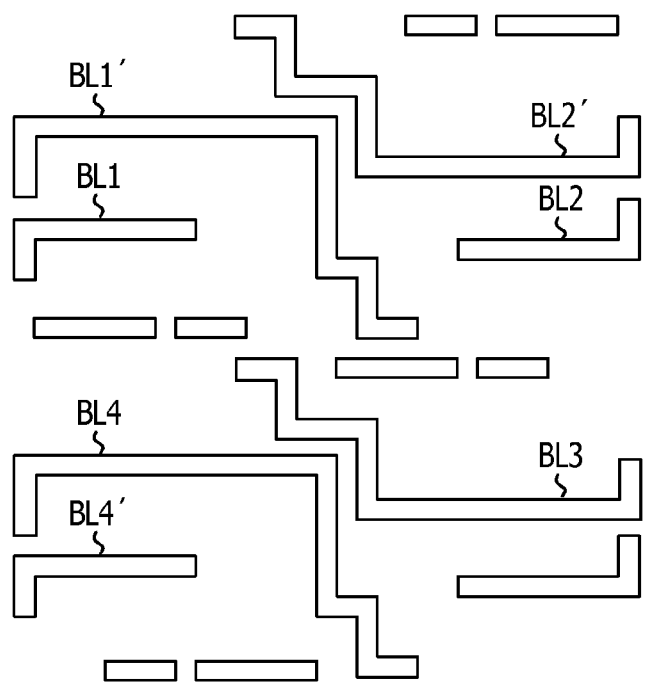
FIG. 8B is a plan view illustrating an example of a second metal wiring pattern for providing the twist illustrated in FIG. 7B.

FIGS. 8A and 8B illustrate examples of the first metal wiring pattern and the second metal wiring pattern for performing the twist illustrated in FIG. 7B. The left part of FIG. 8A corresponds to the left portion of the first metal wiring pattern of the second embodiment illustrated in FIG. 6B. The left part of FIG. 8B corresponds to the left portion of the second metal wiring pattern of the second embodiment illustrated in FIG. 6C. During the transition from the left portion to the right portion, the first metal wiring and the second metal wiring are reversed. To twist the first metal wiring and the second metal wiring without using another wiring layer, some of the bit lines BL are switched between the upper layer and the lower layer in an opposite region across the center serving as the boundary between the left portion and the right portion. The present configuration illustrates an example in which the switching position reaches the positions of the bit line contacts. However, the switching may also be performed at a position closer to the center boundary.

In the second embodiment, the bit lines BL1 and BL4 formed by the second metal wiring are spaced apart from the word line contact regions WC (WS), as illustrated in FIG. 6C. Further, the bit lines BL2 and BL3 formed by the first metal wiring are provided on both sides of the word line contact regions WC (WS), as illustrated in FIG. 6B. With this configuration, the interference between the word line contacts and the bit lines BL is reduced. However, a further reduction of the interference may be desired in some cases.

Figure 9A:
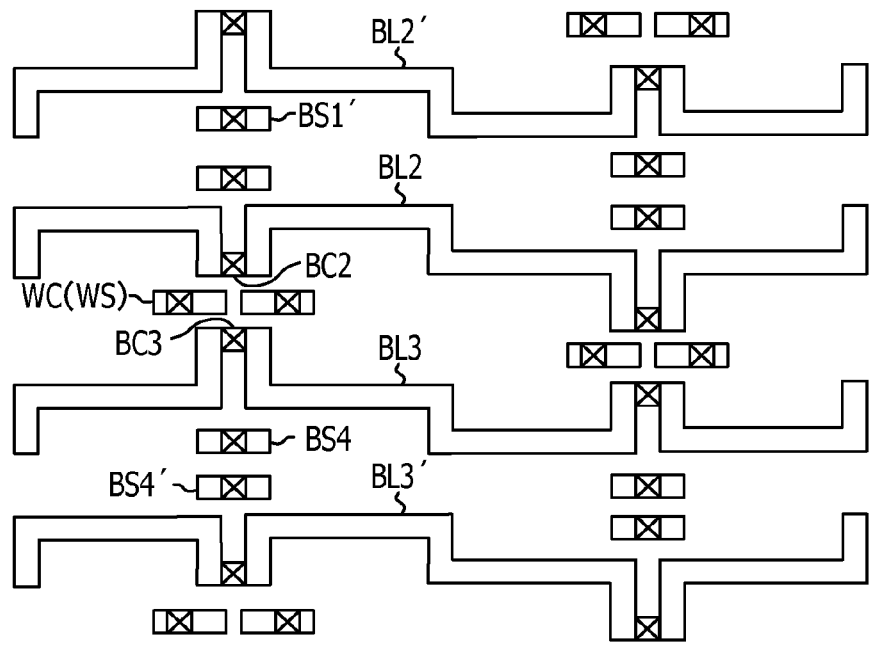
FIGS. 9A and 9B are plan views illustrating modified examples of the first metal wiring pattern.
Figure 9B:
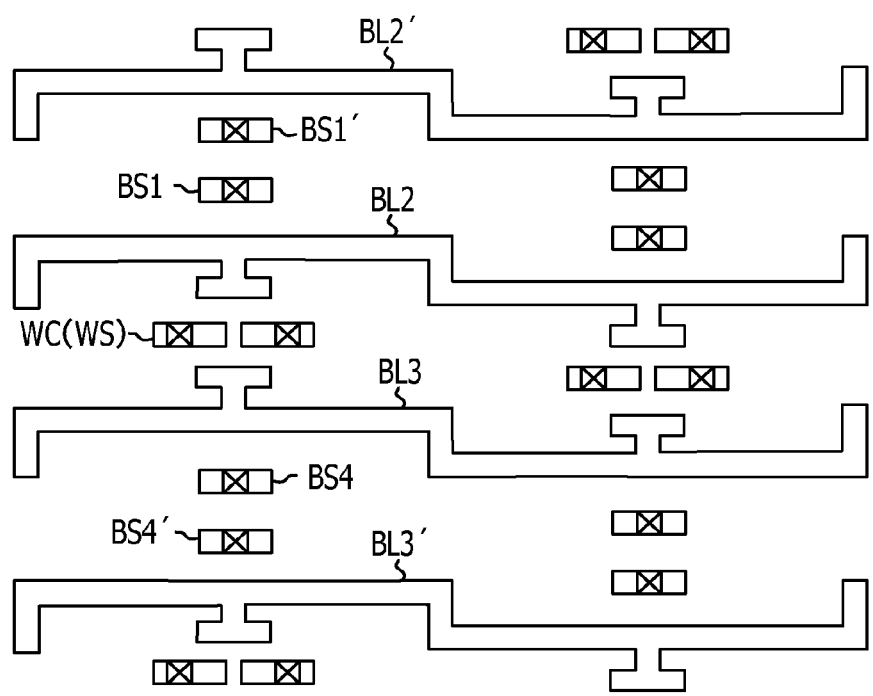

FIGS. 9A and 9B are plan views illustrating modified examples capable of reducing the capacitances between the word line contacts and the bit lines BL. If the active regions AR are arranged at a constant pitch, as illustrated in FIG. 2A, the bit line contacts are also arranged at a constant pitch. For example, four bit lines BL1 to BL4 may form one group. In the configurations of FIGS. 5A and 6A, the word line contact regions WC (WS) are provided between the bit lines BL2 and BL3. The distance between the word line contact regions WC and a bit line BL adjacent thereto is short, and a capacitance is formed between the word line contact regions WC and the bit line BL.

In the configuration of FIG. 9A, the bit lines BL2 and BL3 use bit line contact regions BC2 and BC3 to form contacts in the active regions AR located under the bit lines BL2 and BL3. When the bit lines BL2 and BL3 are separate from the bit line contact regions BC2 and BC3, the bit line positions are shifted in a direction intersecting with the extending direction of the bit lines BL (word line direction) to thereby increase the distance from the word line contact regions WC. Accordingly, the effective capacitances between the bit lines BL2 and BL3 and the word line contact regions WC may be reduced.

In FIG. 9B, the positions of the bit lines BL2 and BL3 in the word line direction are shifted in a direction away from the word line contact regions WC, and side chains are formed to form bit line contacts. Therefore, it is unnecessary to form U-shaped portions of the configuration of FIG. 9A. Accordingly, it is possible to simplify the pattern, and to suppress an increase of the bit line length.

In the memory cells MC illustrated in FIGS. 2A to 2D, the counter electrodes CE are arranged not to cover the end portions of the active regions AR extending in the first direction. Therefore, even if a mask for patterning the counter electrodes CE is misaligned, variation of capacitances of the formed capacitors Cap may be suppressed. If the active regions AR have a rectangular shape with linear lateral sides, the number of corners to be rounded may be reduced. Therefore, it is easy to increase the accuracy of etching processing, and to perform patterning.

If the capacitors Cap are formed in the concave portions having a depth equal to or greater than the width of the active regions AR, the capacitance may be increased, as compared with the configuration in which the capacitors Cap are formed only on the surfaces of the active regions AR. If the depth of the concave portions is set to be equal to or greater than twice the width of the active regions AR, it is possible to achieve a capacitance equal to or greater than five times the capacitance obtained by forming the capacitors Cap only on the surfaces of the active regions AR.

If the capacitor dielectric film $3c$ is formed by thermal oxidation on the (001) plane of the silicon substrate 1, and on the side surfaces of the active regions AR substantially lying in the (100) or (010) plane, a thin insulating film may be highly accurately formed due to the oxidation rate on the (100), (010), and (001) planes, which is lower than the oxidation rate in other plane directions.

Each of the bit line contact regions BC has an empty space on both sides thereof in the column direction, and thus the positional allowances for forming the bit line contacts are large. Further, there are gaps between wirings of the upper layer, and thus the inter-wiring capacitance may be reduced.

Further, if the capacitors Cap formed on both sidewalls of the active regions AR are complete depletion capacitors in which depletion layers present in both capacitor portions contact each other, the following advantages are provided.

The first advantage is a reduction in threshold voltage of the capacitor portions. As described previously, a voltage is applied to the counter electrodes $4c$ to form channels in the capacitor portions and form capacitances. If the threshold value is reduced, the potential applied to the counter electrodes $4c$ may be reduced. If the potential of the counter electrodes $4c$ may be reduced, it is also possible to reduce the thickness of the capacitor dielectric film $3c$ used to form the capacitances.

An increase in the refresh time is another effect. The stored charges are gradually reduced due to current leakage and so forth. It is known that the speed of charge loss is particularly fast in some cells due to metal impurities and crystal defects. If complete depletion capacitors are used, charges stay in the depletion layers even in presence of metal impurities and crystal defects. Accordingly, the time of charge flow into the substrate may be reduced.

A manufacturing process of the memory cells MC each formed by the access transistor Tr and the capacitor Cap illustrated in FIGS. 2A to 2D will be described below.

Figure 10A:
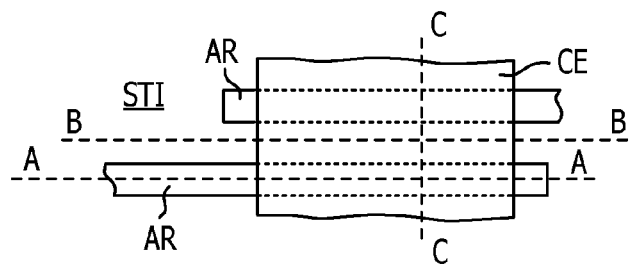
FIG. 10A is a plan view of memory cells.

FIG. 10A is a partial plan view of memory cell portions similar to FIG. 2B. The drawing illustrates two active regions AR arranged in the vertical direction, an STI region surrounding the active regions AR, and a counter electrode CE for capacitor portions. Each of the active regions AR has, for example, a width of approximately 70 nm to 110 nm and a length of approximately 1000 nm to 2000 nm. The active regions AR are surrounded by the shallow trench isolation (STI) region. The intervals of the STI region between the active regions AR in the width direction have a size of approximately 70 nm to 110 nm, for example. The intervals of the STI region between the active regions AR in the length direction have a size of approximately 300 nm to 700 nm, for example. The lines A-A, B-B, and C-C indicate three cross-sectional directions. The following drawings illustrate cross-sectional views in the three directions.

Figure 10B:
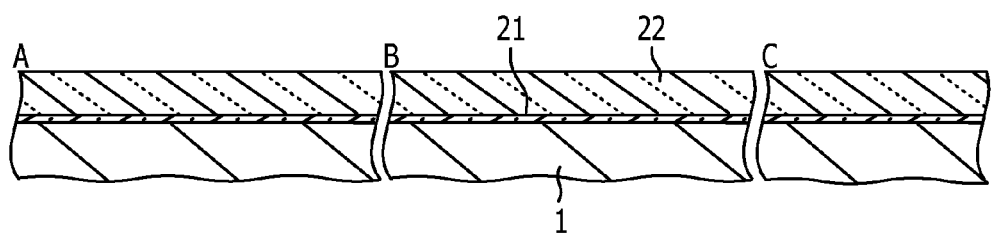
FIGS. 10B to 10L are cross-sectional views of a semiconductor substrate illustrating a manufacturing process of memory cells.

As illustrated in FIG. 10B, a surface of a (001) silicon substrate 1 is thermally oxidized to form a buffer oxide film 21 having a thickness of 5 nm to 20 nm. On the buffer oxide film 21, a silicon nitride film 22 having a thickness of 50 nm to 200 nm is deposited by thermal chemical vapor deposition (CVD) at a temperature of 600° C. to 800° C. with the use of, for example, silane-based gas and ammonia as source gas. At this stage, the entire silicon substrate 1 has a uniform structure.

Figure 10C:
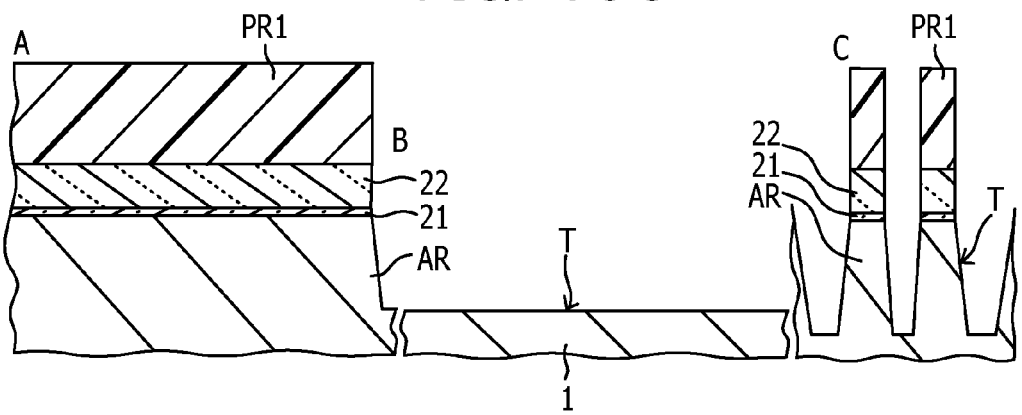

As illustrated in FIG. 10C, a resist pattern PR1 having the shape of the active regions AR is formed on the silicon nitride film 22. The silicon nitride film 22 and the buffer oxide film 21 are patterned by dry etching using, for example, tetrafluorocarbon (CF4) as etching gas, to form a hard mask. The resist pattern PR1 may be removed to leave only the hard mask. The silicon substrate 1 exposed through the mask is dry-etched with the use of, for example, hydrogen bromide (HBr) and chlorine (Cl2) as etching gas. Thereby, trenches T having a depth of approximately 150 nm to 350 nm are formed to surround the active regions AR. Any residues of the resist pattern PR1 are removed by a resist removal solution, ashing, or the like. As illustrated in the cross section cut along the line C-C, the depth of the trenches T is desired to be greater than the width of the active regions AR, e.g., equal to or greater than twice the width of the active regions AR.

Figure 10D:
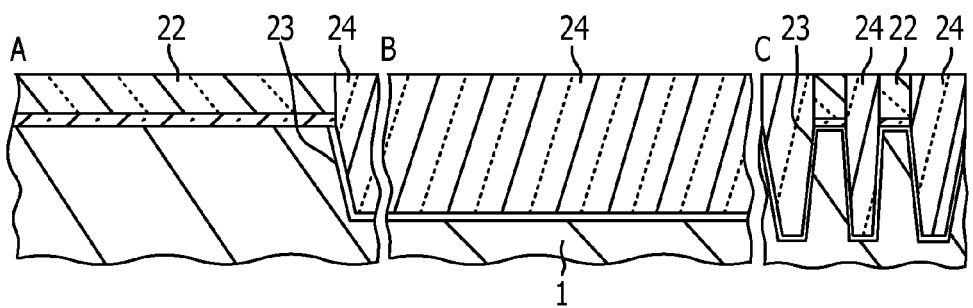

As illustrated in FIG. 10D, a silicon oxide film liner 23 having a thickness of approximately 2 nm to 10 nm is formed by thermal oxidation on the exposed silicon surface. On the silicon oxide film liner 23, an HDP silicon oxide film formed by high-density plasma (HDP) CVD using silane-based gas and oxygen or a TEOS silicon oxide film formed by CVD using tetraethoxysilane (TEOS) and oxygen (hereinafter simply referred to as the silicon oxide film 24) is deposited. Thereby, the trenches T are filled in. Chemical mechanical polishing (CMP) is performed from above to expose the silicon nitride film 22 functioning as a CMP stopper. Illustration of the silicon oxide film liner 23 will be omitted.

Figure 10E:
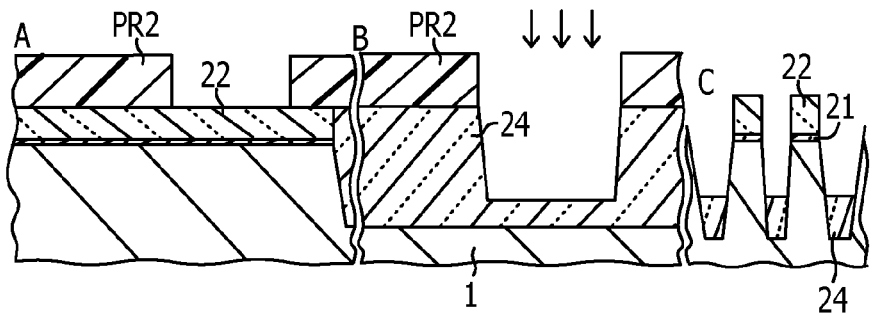

As illustrated in FIG. 10E, a resist pattern PR2 is formed which has openings substantially the same in shape as the counter electrodes CE, one of which is illustrated in FIG. 10A. The silicon oxide film 24 exposed through the openings is etched with, for example, tetrafluorobutadiene (C4F6) as etching gas to leave a bottom portion of the silicon oxide film 24 having a thickness of 50 nm to 150 nm desired for element isolation. Thereby, the sidewalls of the active regions AR are exposed. In this etching, the silicon nitride film 22 functions as an etching mask. Thereafter, the resist pattern PR2 is removed.

Figure 10F:
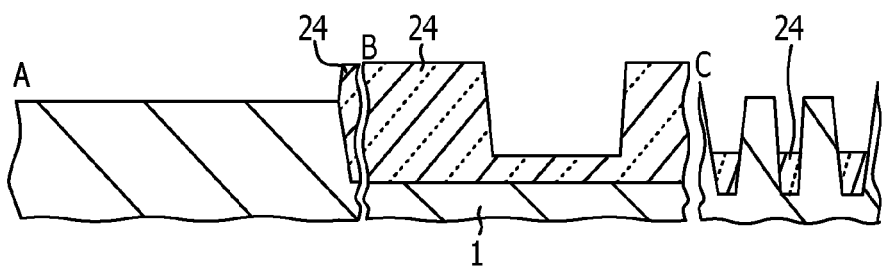

As illustrated in FIG. 10F, the silicon nitride film 22 is boiled in a phosphoric acid solution or a mixed solution of phosphoric acid and fluoric acid, and is washed out. Further, the silicon oxide film 21 is also washed out in a diluted fluoric acid solution or the above-described mixed solution. The silicon oxide film 24 is also etched slightly, but the most of the silicon oxide film 24 remains.

Figure 10G:
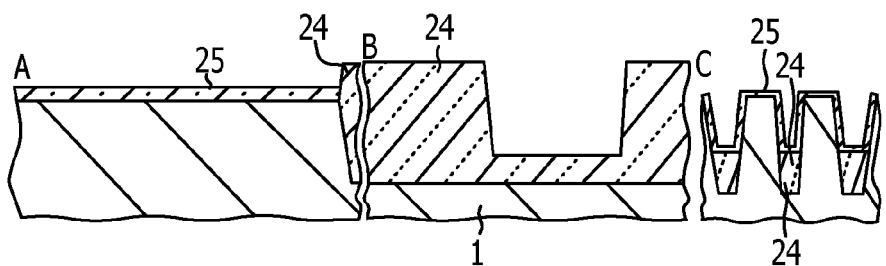

As illustrated in FIG. 10G, the exposed silicon surface is thermally oxidized to form a sacrificial silicon oxide film 25 having a thickness of approximately 5 nm to 10 nm for ion implantation.

Figure 10H:
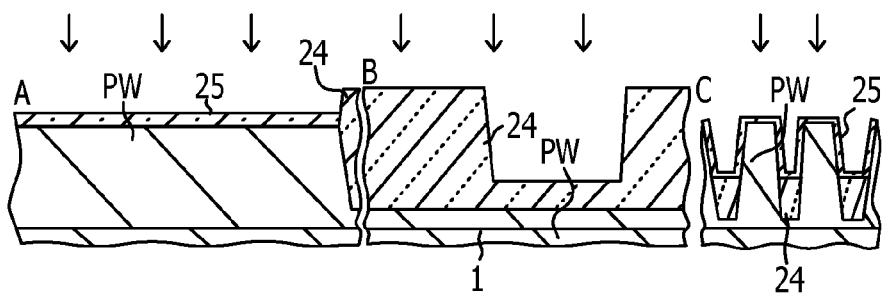

As illustrated in FIG. 10H, ions of a p-type impurity (n-type impurity in p-type cells) are implanted into the silicon substrate 1 through the sacrificial silicon oxide film 25 a plurality of times with different acceleration energies. Thereby, p-type wells PW (n-type wells NW in p-type cells) are formed. Thereafter, the sacrificial silicon oxide film 25 is removed.

Figure 10I:
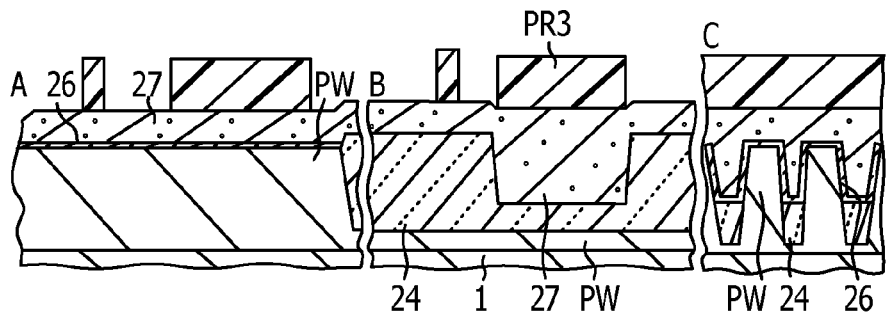

As illustrated in FIG. 10I, the exposed silicon surface is cleaned and thermally oxidized to form a gate oxide film 26 having a thickness of approximately 2 nm to 7 nm. On the gate oxide film 26, a polycrystal silicon film 27 having a thickness of approximately 70 nm to 150 nm is deposited by thermal CVD at a substrate temperature of 400° C. to 750° C. with the use of a silane-based gas and hydrogen. Amorphous silicon may be deposited on the gate oxide film 26 and subjected to heat treatment to be crystallized. On the polycrystal silicon film 27, a resist pattern PR3 having the shape of the word lines WL and the counter electrodes CE is formed. Patterns for forming the counter electrodes CE are substantially the same in size as the openings for forming the concave portions for the capacitors Cap. After the formation of the concave portions, however, the silicon oxide film 24 is slightly etched, and the concave portions have an increased width. The increase in width increases the degree of positioning error. The thickness of the polycrystal silicon film 27 is preferably selected to fill in the trenches T. With the use of the resist pattern PR3 as an etching mask, the polycrystal silicon film 27 is etched to pattern gate electrodes G (word lines WL) and the counter electrodes CE. Thereafter, the resist pattern PR3 is removed. A silicon nitride film or the like may be formed under the resist pattern PR3 to form a hard mask.

Figure 10J:
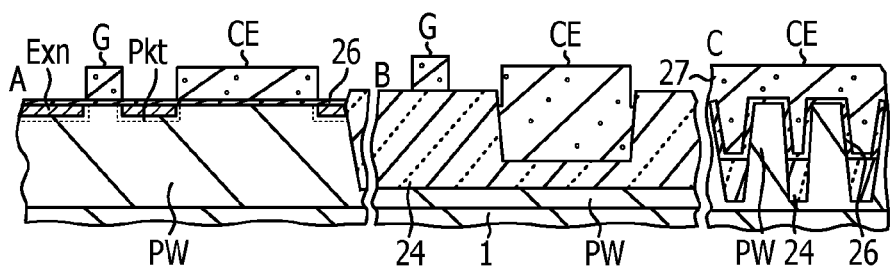

As illustrated in FIG. 10J, with the use of the gate electrodes G and the counter electrodes CE as masks, ions of an n-type impurity such as As (p-type impurity such as B in p-type cells) are implanted to form extensions Exn. Ions of a p-type impurity such as In may be implanted by oblique ion implantation to form p-type pocket regions Pkt surrounding n-type extensions (in p-type cells, ions of an n-type impurity such as P may be implanted to form n-type pocket regions). The pocket regions are conductive, as are the wells, and thus the illustration thereof will be omitted. Ion implantation is not performed in the portions of the active regions AR corresponding to the capacitor portions covered by the counter electrodes CE. Rapid thermal annealing (RTA) is performed at a temperature of 900° C. to 1100° C. for a time of one second or less to approximately fifteen seconds. Thereby, the implanted impurity is activated.

Figure 10K:
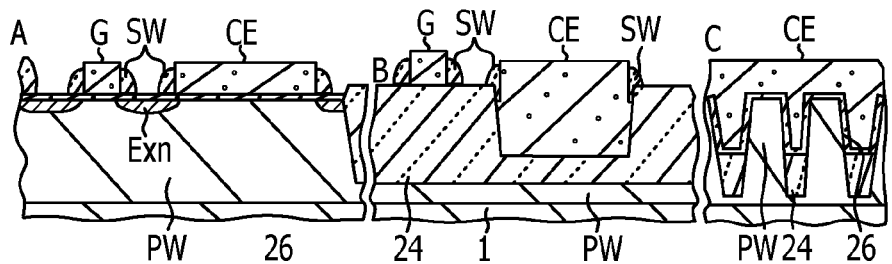

As illustrated in FIG. 10K, an insulating film made of silicon oxide, silicon nitride, or the like and having a thickness of approximately 30 nm to 80 nm is deposited on the semiconductor substrate to cover the gate electrodes G. Anisotropic etching such as reactive ion etching is performed to leave sidewall spacers SW only on the sidewalls of the gate electrodes G (and the counter electrodes CE). Sidewall spacers of another publicly known configuration, such as layered sidewall spacers, may also be formed.

Figure 10L:
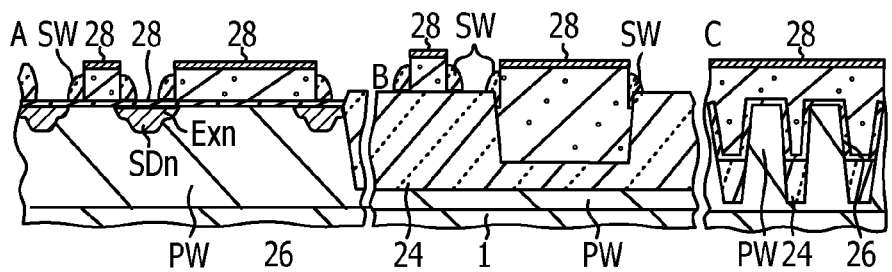

As illustrated in FIG. 10L, with the use of the sidewall spacers SW as masks, ions of an n-type impurity such as P are implanted (in p-type cells, ions of a p-type impurity such as B are implanted) to form low-resistance source/drain regions SDn. Further, activation treatment may be performed. After the removal of the oxide film on the silicon surface, a Co film or a Ni film is formed by sputtering or the like on the substrate surface. Heat treatment is performed to cause silicidation reaction, and an unreacted portion is washed out. The heat treatment may be performed again to form a silicide film 28.

In the above-described manner, the memory cells MC are formed. If the memory cells MC are integrated in a CMOS logic circuit, NMOS (PMOS in p-type cells) transistors of the logic circuit and the access transistors Tr of the memory cells MC may be formed in a common process. In the present embodiment, a specific potential is applied to the counter electrodes CE sterically formed in the capacitor regions to form channels in the surface of the silicon substrate 1. Thereby, the access transistors Tr and the capacitors Cap are connected to each other. As another method, an impurity may be implanted into portions of the surface of the silicon substrate 1 corresponding to the capacitor regions so that electrical connection with the sources and drains of the access transistors Tr is established. Thereafter, a lower interlayer insulating film is formed to cover the memory cells MC (and the MOS transistors of the logic circuit). The contact holes are formed by etching and filled with conductive plugs. Thereby, the configuration as illustrated in FIG. 2C is obtained.

Further, multilayer wiring is formed by, for example, the process disclosed in an embodiment of Japanese Unexamined Patent Application Publication No. 2004-172590 (U.S. Pat. No. 6,949,830).

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a semiconductor substrate;
    a memory cell array including a plurality of memory cells formed on the semiconductor substrate and arranged in a matrix in a first direction and a second direction on the surface of the semiconductor substrate;
    a plurality of sense amplifiers formed on the semiconductor substrate and including a first sense amplifier and a second sense amplifier; and
    a plurality of bit lines extending along the first direction above the memory cell array, and arranged side by side in the second direction,
    wherein the plurality of bit lines include a first bit line pair formed in a first wiring layer made up of a pair of bit lines, and a second bit line pair formed in a second wiring layer located above the first wiring layer made up of a pair of bit lines, and
    wherein the first bit line pair is connected to the first sense amplifier, and the second bit line pair is connected to the second sense amplifier.

2. The semiconductor device according to claim 1,
    wherein each memory cell in the plurality of the memory cells includes
    a selection transistor including a gate electrode, a bit line contact region formed on one side of the gate electrode, and a source/drain region formed on the other side of the gate electrode, and
    a capacitor connected to the source/drain region.

3. The semiconductor device according to claim 2,
    wherein a portion of the plurality of memory cells arranged along the second direction include a first memory cell group and a second memory cell group,
    wherein a plurality of the gate electrodes include a first gate electrode and a second gate electrode, and
    wherein each memory cell included in the first memory cell group share the first gate electrode, and each memory cell included in the second memory cell group share the second gate electrode.

4. The semiconductor device according to claim 3, further comprising:
    a plurality of word lines formed in a third wiring layer located above the memory cell array, extending along the second direction, and arranged side by side in the first direction,
    wherein the plurality of word lines includes a first word line and a second word line, and
    wherein the first word line is connected to the first gate electrode in a first word line contact region, and the second word line is connected to the second gate electrode in a second word line contact region.

5. The semiconductor device according to claim 4,
    wherein the first memory cell group and the second memory cell group are alternately arranged in the second direction, and
    wherein the first word line contact region and the second word line contact region are alternately arranged in the second direction.

6. The semiconductor device according to claim 4,
    wherein the first wiring layer, the second wiring layer, and the third wiring layer are formed upward in order from the semiconductor substrate.

7. The semiconductor device according to claim 4,
    wherein the first memory cell group is connected to four bit lines, and the first word line contact region is located at a position dividing the four bit lines into groups each including two bit lines, and
    wherein two bit lines of the four bit lines are formed in the same wiring layer and are located in between the other two bit lines formed in a different wiring layer.

8. The semiconductor device according to claim 7,
    wherein the two bit lines of the four bit lines located in between the other two bit lines are formed in the first wiring layer, and the other two bit lines are formed in the second wiring layer.

9. The semiconductor device according to claim 8,
    wherein the two bit lines located in between the other two bit lines are arranged to switch, in an intermediate region of a bit line path, from the first wiring layer to the second wiring layer, and wherein the two other bit lines are arranged to switch, in the intermediate region of a bit line path, from the second wiring layer to the first wiring layer.

10. The semiconductor device according to claim 4,
wherein each of the bit lines is connected to the bit line contact region via a conductive plug formed on the bit line contact region,
wherein the first word line is connected to the first gate electrode via a conductive plug formed on the first word line contact region, and
wherein the second word line is connected to the second gate electrode via a conductive plug formed on the second word line contact region.

11. The semiconductor device according to claim 2,
wherein the semiconductor substrate includes a plurality of active regions extending in the first direction, and an element isolation region formed between the active regions, and
wherein the capacitor included in each of the active regions is formed in a portion including a wall of the element isolation region.

* * * * *